United States Patent [19]

McCorkle

[11] Patent Number: 4,906,864
[45] Date of Patent: Mar. 6, 1990

[54] LINEAR SLOPE PEAK DETECTOR

[75] Inventor: Gary A. McCorkle, Tucson, Ariz.

[73] Assignee: United Technologies Corporation, Hartford, Conn.

[21] Appl. No.: 368,925

[22] Filed: Jun. 19, 1989

Related U.S. Application Data

[63] Continuation of Ser. No. 656,568, Oct. 1, 1984, abandoned.

[51] Int. Cl.$^4$ ............................................. H03K 5/153
[52] U.S. Cl. .................................... 307/351; 307/359; 324/103 P; 328/116; 328/151
[58] Field of Search ................ 307/351, 359; 328/115, 328/116, 151; 324/103 P

[56] References Cited

U.S. PATENT DOCUMENTS 4,000,366 12/1976 Sirrine ................................. 307/359

Primary Examiner—John Zazworsky

[57] ABSTRACT

A linear slope peak detector is disclosed in which the output of an integrator is compared to an input signal and a low impedance path is provided for quickly capturing peaks while at the same time minimizing droop between peak refreshes. The peak detector is well suited for determining DC offsets.

1 Claim, 1 Drawing Sheet

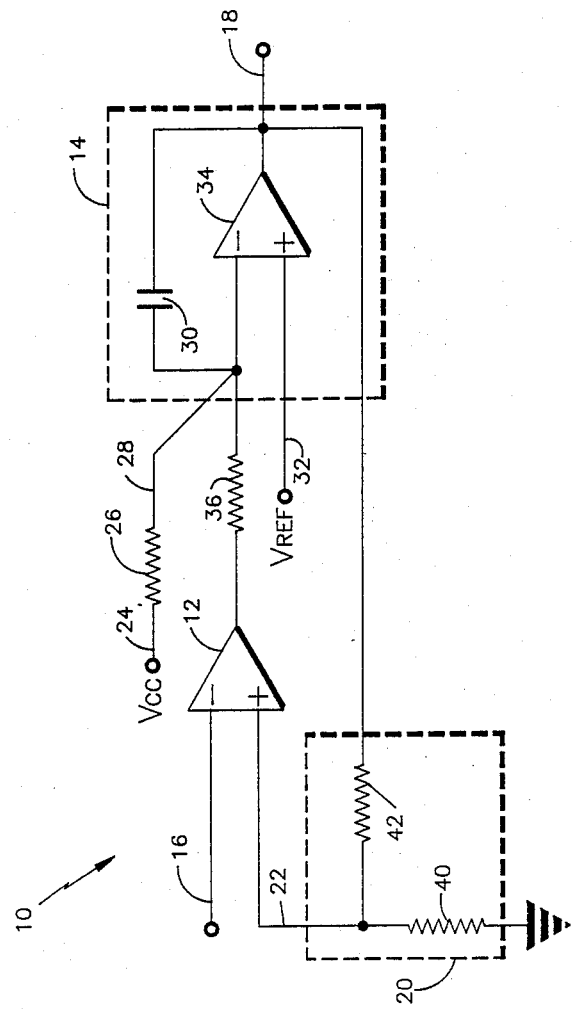

1

LINEAR SLOPE PEAK DETECTOR

CROSS REFERENCE TO RELATED APPLICATION

This application is a continuation of U.S. Ser. No. 656,568 filed Oct. 1, 1984, now abandoned.

TECHNICAL FIELD

This invention relates to a Linear slope Peak Detector for use in circuits in which a highly accurate peak value is desired.

BACKGROUND ART

Peak detectors, according to the prior art typically utilize an operational amplifier (opamp) circuit to acquire and store an incoming signal peak amplitude. This is usually done by routing the input signal to the noninverting input of an opamp. The output of the opamp passes through a diode to an RC circuit and also to the inverting input of the same opamp to provide negative feedback. The other end of the RC circuit is connected to ground. Whenever the input signal voltage is more positive than the voltage level presently stored in the capacitor of the RC circuit (and that of the inverting input of the opamp) the opamp output will go more positive relative to that stored voltage and start to charge the RC circuit capacitor. The negative feedback from the RC circuit to the inverting input of the opamp provides the means to assure that the opamp output will be that level necessary to cause the stored value in the RC circuit to track any input excursion that exceeds any previously stored value. When the input signal drops below any peak value stored in the RC circuit the diode between the opamp output and the RC circuit prevents the capacitor from being rapidly discharged through the opamp and losing the peak value. Instead, the resistance element provides a controlled discharge path. The size of the resistor is dictated by the size of the capacitor and the rate at which it is desirable to have the stored value decay in order to follow successive peak amplitude levels which may be on the decrease.

This type of a Peak Detection scheme suffers from various disadvantages which are fully described in copending application U.S. Ser. No. 656,570, entitled SIGNAL CONDITIONING CIRCUIT FOR L/R VDT SENSORS, invented by the inventor of the Peak Detector disclosed herein, and assigned to common assignee, and the contents of that application are hereby expressly incorporated herein by reference.

During the design phase of the above described copending application, a new Peak Detection scheme was discovered which has potential applications far wider than the limited uses described in said copending application.

DISCLOSURE OF INVENTION

The object of the present invention is to provide a highly accurate Linear slope Peak Detector.

According to the present invention, a Peak Detector is comprised of an integrator having an operational amplifier with a capacitor hooked up between its inverting input and its output, and having a reference voltage connected to its non-inverting input; the Peak Detector also having a comparator responsive to the present value of a incoming time-varying signal and responsive to a scaled signal having a magnitude indicative of the integrator's output signal, the comparator comparing the present value of the incoming signal to the scaled output signal from the integrator and providing a low impedance output state at the comparator's output in the presence of the absolute value of the incoming signal being greater than the absolute value of the scaled integrator signal and providing a high impedance state otherwise; the Peak Detector also having a relatively small-valued resistor connected between the output of the comparator and the inverting input of the integrator and having a relatively high-valued resistor connected between the integrator's inverting input and another reference voltage for providing a charging path for the integrator's capacitor, the low-valued resistor providing a relatively quick charging path for the capacitor for rapidly detecting a change in the incoming signal amplitude and thereby providing the integrator with a means of quickly reflecting that change at its output. The relatively high-valued resistor is much greater in value than the relatively small-valued resistor.

The Peak Detection technique disclosed is used in preference to the typical opamp driven RC circuit for a number of reasons. The changing input signal may involve either an increase or decrease in peak amplitude. The Peak Detector must be responsive to maximum input signal peak amplitude slew rate on either the increase or decrease. Also, the error from peak refresh to peak refresh must be constrained to some specified maximum. This is usually the case because the peak detector output will usually be sampled by an asynchronous analog to digital converter anywhere from at the moment the peak occurs when a minimum error condition would exist to just before the next refresh when the Peak Detector "droop" error would be at a maximum. Concurrent to the ability to respond to a maximum signal input signal peak slew on a decreasing level, it may also be desirable to have the Peak Detector be able to go to whatever the intrinsic circuit DC level is within a reasonable and predictable time subsequent to excitation shutdown. This would be true in circuit designs in which the excitation is periodically shutdown in order to measure the intrinsic DC levels.

A conventional Peak Detector with a bleeder resistor to allow decay to sucessively decreasing amplitude peaks has a different relationship between its decay slew rate and the steady state Peak Refresh to Peak Refresh error then the comparator/integrator Peak Detector disclosed herein. For the Best Mode Embodiment disclosed in the copending application incorporated here above, the initial objective, based on a 5KHz excitation frequency (which translates to 200 microseconds between refresh), was to minimize droop to approximately 25mV. This number was based mostly on the design goal of a maximum of just slightly less than 2.5V for a full scale signal on the Peak Detector output. A quick calculation for both the conventional peak detector with a bleeder resistor, and the method used shows that for a 220K resistor and a 0.082 microfarad capacitor, the droop voltage at full scale is 27mV. However, there is a dramatic difference in slew rate capabilities. It can be shown that the conventional peak detector with the bleeder scheme has only asymptotically approached the final near 0V level to within 10mV at 100ms whereas the method using the comparator/integrator has gone directly to and held at the final value in only 18.2ms. What this means is that for a given droop error limit, the comparator/integrator method slews faster and holds to a final level far better than the conventional peak detector. This also means that for the comparator/integrator method, a sizeable increase in the decay slope resistors could be tolerated to decrease the slew rate and still be compatible with a decrease in the droop error by the same proportionality (e.g., decrease the slew rate by a factor two and decrease droop by the same factor: 18.2ms to 36.4 ms full scale slew, 27 mV to 13.5 mV droop). To try to improve the long term slew rate of the conventional peak detector by decreasing the bleeder resistor will cause more droop error. In summary, the linear slope derived by the comparator/integrator method disclosed herein offers more advantages in the droop error verses slew rate tradeoff than the exponential slope that one gets with the conventional peak detector method.

The attack time (i.e., the slew rate when responding to a peak) is on the order of 50 times faster than the decay rate as shown in the Best Mode Embodiment. This permits the peak detector to track the profile of the input signal whenever the input signal exceeds the scaled output of the integrator. The practice of the invention, of course, is not restricted to such an exact figure of 50 times faster. The selection of the resistive values will dictate the exact figure.

If it is desired to suspend the signal feeding the peak detector via an external circuit, i.e., if it is desirable to measure the DC offsets which vary as a consequence of temperature changes and aging, the peak detector according to the present invention presents particular advantages. A conventional peak detector only asympotically approachs the DC offset level because of the nature of the exponential decay. With the values used in the Best Mode Embodiment, the conventional method was shown to be only within 10 mV of the final value after 100 ms, whereas the comparator/integrator method had ramped down to and held at the final value in 18.2 ms. Again, if affected by slew rate versus droop error tradeoffs, the comparator/integrator method still offers the advantage of eliminating the ambiguity of the asymptotic approach of the conventional peak detector to the final value.

Note that there is a certain amount of signal "dither" around the DC level if the external excitation is shutdown to observe inherent DC levels. This is because the integrator always has the decay rate imposed because of the permanent hook-up of the integrator resistor affecting decay to $V_{cc}$. Accordingly, once the DC level is acquired, a decay will occur until the comparator detects sufficient difference between the DC level input to itself and the integrator output and restores the integrator output to a proper level. The periodicity and amplitude of this "dither" is a function of comparator and opamp gains plus propagation delays. Observation of this "dither", which shows up as a sawtooth waveform on an oscilloscope, shows it to have an amplitude of roughly 25 mV, or roughly the same error as the droop error at 5 KHz.

Although the period of time is not completely necessary for the component values shown in the Best Mode Embodiment, it is suggested that the use of any suspension of the input signal and the sampling of DC levels be synchronized externally with the timed activities of any external controller. For instance, if the controller's activities are timed to sample the peak detector output at 40 ms intervals, the shutdown signal could be asserted on a selected 40 ms event. Upon the next 40 ms event, the sampling of the peak detector would occur. The next 40 ms event following the completion of the channel sampling (assuming conversion times are taken into account) would enable the input signal. At the 40 ms period then following, normal peak detector output sampling could resume. Since the overall period of time involved is relatively lengthy compared to other events, the scheduling of the shutdown sequence would be on the order of once every few seconds or more.

These and other objects, features, and advantages of the present invention will become more apparent in the light of the following detailed description of a Best Mode Embodiment thereof, as illustrated in the accompanying drawing.

BRIEF DESCRIPTION OF THE DRAWING

The sole FIGURE is illustrative of a peak detector according to the present invention.

BEST MODE FOR CARRYING OUT THE INVENTION

The FIGURE is an illustration of a peak detector 10 according to the present invention and is designed for unipolar power supply operation and detection of positive going above zero signal peaks. While the best mode embodiment shown herein acquires and holds positive peaks, it should be understood that by rearranging the inverting and noninverting inputs to the comparator and opamp integrator a peak detector for acquiring and holding negative going peaks may be effected using this comparator-integrator method. Similarly, bipolar power supply operation can provide for either positive-going or negative-going peak detection operation above and below zero volts.

Peak detector 10 includes a comparator 12 and a switched input integrator 14. An input signal on a line 16 is presented to the inverting first input of the comparator 12. The output of the integrator 14 on a line 18 is provided to a voltage divider 20 which scales the integrator output voltage on the line 18 to be compatible with the input signal level on the line 16 presented to the comparator 12. The scaled voltage is presented to the comparator 12 at its non-inverting second input on a line 22.

The integrator 14 is supplied with a constant first reference voltage $V_{cc}$, on a line 24 which provides charging current through a resistor first 26 on line 28 to the integrator's inverting input and the integrator's capacitor 30. A second reference voltage, $V_{REF}$, is supplied on a line 32 to the non-inverting input of the integrator's amplifier 34. $V_{REF}$ may in unipolar operation be selected, for example, to be one half the value of $V_{cc}$ so that the normal quiescent voltage value on the line 18 is also equal to one half $V_{cc}$.

Whenever the magnitude of the signal on the line 16 exceeds the magnitude of the signal on the line 22, the comparator 12 will, in effect, switch a resistor 36 into the inverting input of the integrator with the reference potential of ground as the driving signal. This causes the integrator output signal on the line 18 to ramp in the positive direction until a proportional, scaled version of its output on the line 22 equals or exceeds the magnitude of the signal on the line 16. When this condition is reached, the comparator goes into a high impedance state (open circuited) and resistor 36 no longer connects to ground, leaving only the resistor 26 connected to the driving voltage on the line 24. Resistor 26 is selected to have a resistive value much larger than the resistive value of resistor 36. Since resistor 26 is much larger than resistor 36 and is also connected to $V_{cc}$, the integrator output signal on the line 18 slowly ramps (decays) down between each positive going peak from the input. Gain in this stage is provided by the voltage division of a resistor 40 and a resistor 42 in the voltage divider 20. Essentially, the output of the integrator has to be that level that when applied to the voltage divider resistors 40, 42 results in a match to the input signal to the comparator 12.

Although the invention has been shown and described with respect to a Best Mode Embodiment thereof, it should be understood by those skilled in the art that the foregoing and various other changes, ommission, and additions in the form and detail thereof may be made therein without departing from the spirit and scope of this invention.

That which I claim, and desire to secure by letters patent, is:

1. A peak detector comprising:
    an integrator including an amplifier having an inverting input, a noninverting input and an output, and a capacitor connected between said output and said inverting input;
    first and second reference voltages applied with respect to a reference potential, said first reference voltage being higher than said second reference voltage, said second reference voltage being connected to said noninverting input;
    a first resistor connected between said first reference voltage and said inverting input;
    a comparator having first and second inputs and an output, said comparator operative in response to a signal at said first input having an absolute magnitude greater than a signal at said second input to cause said comparator output to assume said reference potential, and operative otherwise to cause said comparator output to be open circuited;
    a second resistor, having a resistance much lower than that of said first resistor, connected between said comparator output and said inverting input; and
    means responsive to said integrator for providing a signal at said second input which is proportional to the magnitude of the signal at the output of said amplifier;
    whereby, in response to application of a time varying signal at said first input which is of higher magnitude than said signal at said second input, said inverting input is connected to said reference potential through said second resistor causing said integrator to ramp up, thereby providing a signal at the output of said amplifier indicative of the peak value of said time varying signal.

* * * * *